(12) United States Patent
Asmanis et al.

(10) Patent No.: US 9,614,351 B1
(45) Date of Patent: Apr. 4, 2017

(54) LOW-POWER, DIRECT-DRIVE DRIVER CIRCUIT FOR DRIVING AN EXTERNALLY MODULATED LASER (EML), AND METHODS

(71) Applicant: Avago Technologies General IP (Singapore) Pte. Ltd., Singapore (SG)

(72) Inventors: Georgios Asmanis, Lake Forrest, CA (US); Faouzi Chaahoub, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/080,529

(22) Filed: Mar. 24, 2016

(51) Int. Cl.
| | |
|---|---|
| *H01S 5/042* | (2006.01) |
| *H03H 7/38* | (2006.01) |
| *H01S 5/026* | (2006.01) |
| *H01S 5/00* | (2006.01) |
| *H01S 5/0625* | (2006.01) |
| *H01S 5/12* | (2006.01) |
| *H01S 3/063* | (2006.01) |
| *H01S 3/00* | (2006.01) |
| *H01S 3/10* | (2006.01) |

(52) U.S. Cl.
CPC .......... *H01S 5/0427* (2013.01); *H01S 3/0085* (2013.01); *H01S 3/0635* (2013.01); *H01S 3/10* (2013.01); *H01S 5/0085* (2013.01); *H01S 5/0265* (2013.01); *H01S 5/06258* (2013.01); *H01S 5/12* (2013.01); *H03H 7/38* (2013.01)

(58) Field of Classification Search
CPC ...... H01S 5/0085; H01S 5/06258; H01S 5/12; H01S 5/0265; H01S 3/0085; H01S 3/0635; H01S 3/10
See application file for complete search history.

(56) References Cited

U.S. PATENT DOCUMENTS

| | | | |
|---|---|---|---|
| 7,099,596 B2 | 8/2006 | Watanabe et al. | |
| 7,145,928 B1 | 12/2006 | Maxim et al. | |
| 8,552,420 B2* | 10/2013 | Levermore | H01L 27/3202 257/40 |
| 8,903,254 B2 | 12/2014 | Hu et al. | |
| 2002/0167693 A1* | 11/2002 | Vrazel | G11C 27/02 398/27 |
| 2007/0222654 A1* | 9/2007 | Vrazel | H04B 10/516 341/144 |
| 2008/0292311 A1* | 11/2008 | Daghighian | H04B 10/40 398/9 |
| 2010/0092184 A1* | 4/2010 | Nguyen | H04B 10/2504 398/192 |

OTHER PUBLICATIONS

Hirabayashi, et al., "Development of EA Modulator Driver for 40GbE using InP DHBTs", Anitsu Technical Review No. 23, Sep. 2015.

\* cited by examiner

*Primary Examiner* — Kinam Park

(57) ABSTRACT

A low-power, direct-drive EML driver circuit is provided that reduces power consumption by reducing the amount of current needed to create the necessary voltage swing in the drive signal. In addition, the EML driver circuit has an impedance matching network that has reduced complexity and that can be made at reduced costs compared to the impedance matching network of a typical EML driver circuit.

21 Claims, 3 Drawing Sheets

LOW-POWER, DIRECT-DRIVE DRIVER CIRCUIT FOR DRIVING AN EXTERNALLY MODULATED LASER (EML), AND METHODS

TECHNICAL FIELD OF THE INVENTION

The invention relates to lasers, and more particularly, to a low-power, direct-drive externally modulated laser (EML) driver circuit for driving an EML.

BACKGROUND OF THE INVENTION

A variety of lasers are used in a variety of applications for converting electrical energy into optical energy. For example, in optical communications networks, various types of lasers are used to convert electrical data signals into optical data signals, which are then transmitted over optical waveguides, e.g., optical fibers. One type of laser that is sometimes used for this purpose is an EML, which is a combination of a distributed feedback (DFB) laser diode and an electro-absorption modulator (EAM) integrated on a single optoelectronic integrated circuit (IC) chip. An EML driver IC chip that is external to the EML chip delivers electrical signals to the EAM to cause the EAM to modulate the DFB laser diode.

FIG. 1 is a schematic diagram of a typical EML driver IC chip 2 connected to an impedance matching network 3. For ease of illustration, the EML chip is not shown in FIG. 1. The impedance matching network 3 has a contact pad 4 that connects to an input contact pad of an EML IC chip (not shown). The EML driver IC chip 2 has driver electronics 5 that drive the bases of a differential pair of bipolar junction transistors (BJTs) 6 and 7. The emitters of the BJTs 6 and 7 are connected to one another. A current source 8 represents the output current, $I_O$, of the differential pair 6, 7. The collectors of the BJTs 6 and 7 are connected to respective load resistors ($R_{L1}$ and $R_{L2}$) 11 and 12 that are connected in parallel, where $R_{L1}=R_{L2}=50$ Ohms ($\Omega$) to provide an output impedance of 25$\Omega$. The load resistors $R_{L1}$ 11 and $R_{L2}$ 12 are connected to a supply voltage, $V_{DD}$. The driver electronics 3 drive the bases of the BJTs 6 and 7 to push the output current $I_O$ into the 25$\Omega$ output impedance provided by the parallel load resistors $R_{L1}$ 11 and $R_{L2}$ 12, which causes an output voltage to be produced at the output terminals 13 and 14 of the chip 2 that swings between a positive output voltage, $V_{OUT\_P}$, and a negative output voltage, $V_{OUT\_N}$.

The EML driver IC chip 2 and the EML chip operate at different supply voltages. The impedance matching network 3 matches the output impedance of the EML driver IC chip 2 to the input impedance with the EML chip (not shown). The impedance matching network 3 shown in FIG. 1 generally has become the standard configuration used for EML chips. In order for the impedance matching network 3 to provide the impedance needed to match the output impedance of the EML driver IC chip 2 with the input impedance of the EML chip (not shown), a pair of transmission lines 16 and 17 are used and the EML driver IC chip 2 is located a relatively large distance away from the EML chip. The transmission line 16 has a first portion 16a and a second portion 16b that are interconnected by an alternating current (ac) capacitor 18, which decouples the common modes of the EML driver IC chip 2 from the common modes of the EML chip. The impedance matching network 3 also includes inductors $L_1$ 21, $L_2$ 22 and $L_3$ 23, termination resistor $R_T$ 25, and termination capacitor $C_T$ 26. Contact pad 27 is for connecting the EML chip to the impedance matching network 3 to provide the bias current to the EML chip. Contact pad 4 is for providing the modulation current to the EML chip. A termination network 29 is included to replicate the circuit configuration made up of components 18, 21, 22, 23, 25, and 26.

One of the disadvantages of the arrangement shown in FIG. 1 is that the impedance of the transmission lines 16 and 17 reduces the output voltage swing of $V_{OUT\_P}$ and $V_{OUT\_N}$ by about 50%. Because of the reduction in the output voltage swing, $I_O$ must be increased to achieve the desired output voltage swing, which leads to higher power consumption. Another disadvantage of the arrangement is that the transmission lines 16 and 17 prevent the EML driver IC chip 2 from being placed in close proximity to the EML chip, which makes it difficult to decrease the overall footprint of the layout that includes the EML driver IC chip 2, the impedance matching network 3 and the EML chip (not shown). Yet another disadvantage of the arrangement shown in FIG. 1 is that the termination network 29 increases the complexity and cost of the impedance matching network 3.

A need exists for a low-power, direct-drive EML driver circuit that eliminates the need for the transmission lines 16 and 17 and the termination network 29, thereby allowing power consumption and costs to be reduced without reducing bandwidth, and allowing the EML driver circuit to be placed in close proximity to the EML chip.

DETAILED DESCRIPTION OF AN ILLUSTRATIVE EMBODIMENT

Figure 1:
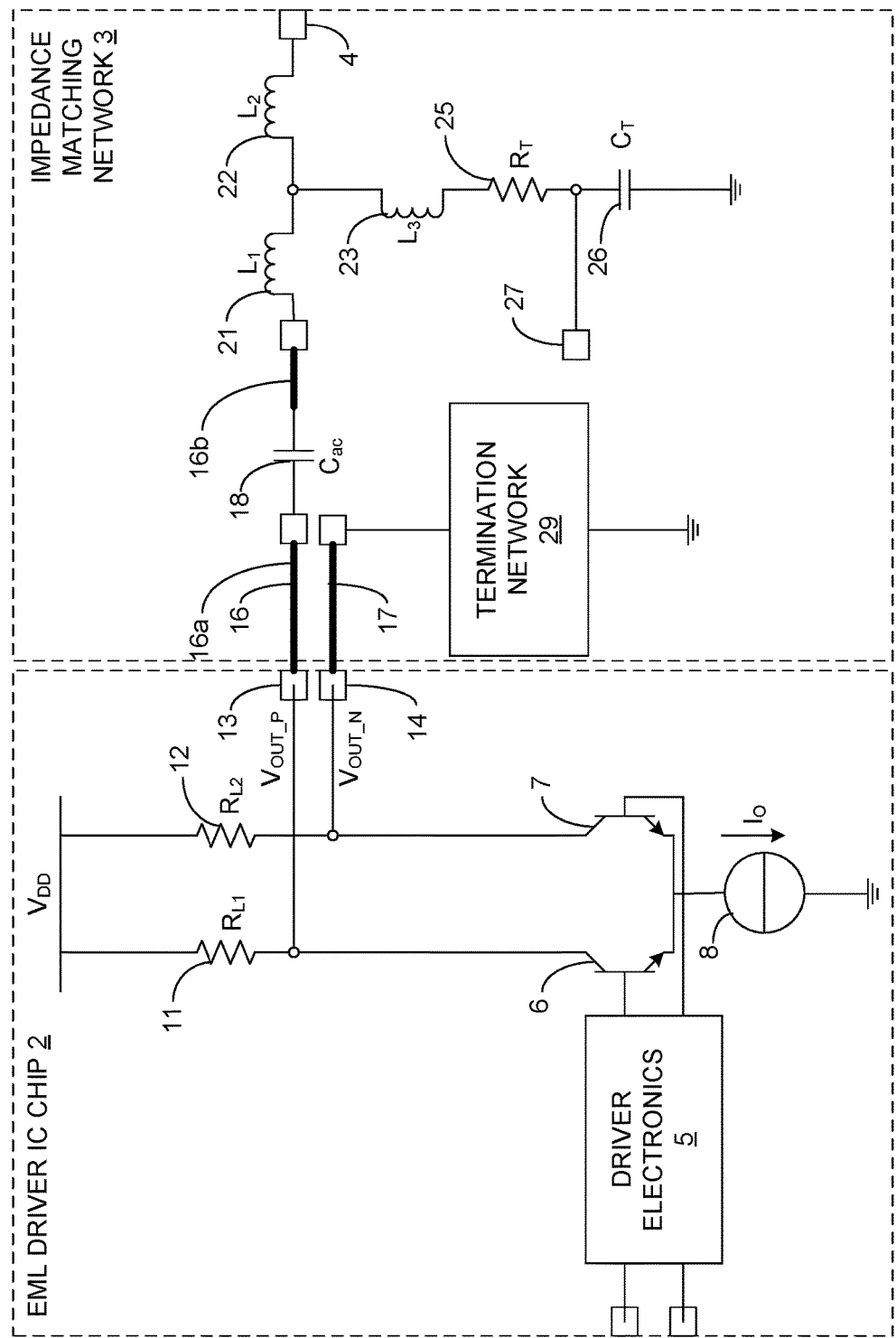
FIG. 1 is schematic diagram of a known EML driver circuit including an EML driver IC chip connected to an impedance matching network that is used to balance the output impedance of the EML driver IC chip with the input impedance of an EML chip.

In accordance with illustrative, or representative, embodiments described herein, a low-power, direct-drive EML driver circuit is provided that reduces the complexity and cost of the impedance matching network by eliminating the transmission lines, that eliminates the reduction in voltage swing caused by the transmission lines without limiting the bandwidth and speed of the direct-drive EML driver circuit, and that reduces power consumption by reducing the current needed to create the voltage swing in the drive signal. Illustrative embodiments of the low-power direct-drive EML driver IC chip will now be described with reference to FIGS. 2 and 3, in which like reference numerals represent like elements, features or components.

As used in the specification and appended claims, the terms "a," "an," and "the" include both singular and plural referents, unless the context clearly dictates otherwise. Thus, for example, "a device" includes one device and plural devices.

It should be noted that when an element is referred to herein as being "connected to" or "coupled to" or "electrically coupled to" another element, it can be directly connected or coupled, or intervening elements may be present.

Figure 2:
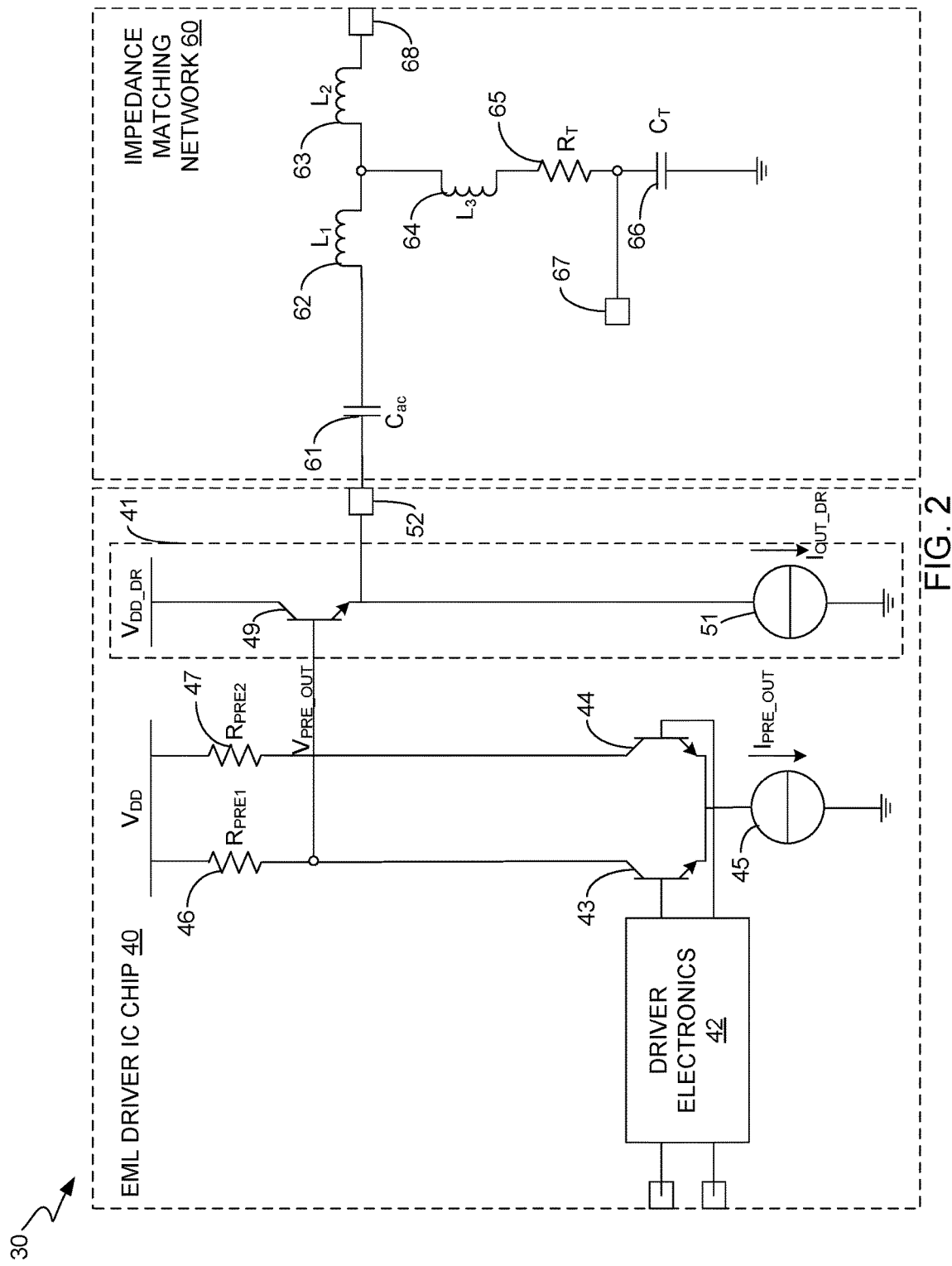
FIG. 2 is schematic diagram of a low-power, direct-drive EML driver circuit in accordance with an illustrative embodiment that produces a single-ended drive signal.

FIG. 2 is a schematic diagram of a low-power, direct-drive EML driver circuit 30 in accordance with an illustrative embodiment that produces a single-ended drive signal. The low-power, direct-drive EML driver circuit 30 includes an EML driver IC chip 40 and an impedance matching network 60. While the impedance matching network 60 is shown as being separate from the EML driver IC chip 40, they may be integrated together on the EML driver IC chip 40. In accordance with this illustrative embodiment, the EML driver IC chip 40 includes a voltage follower 41 that acts as a voltage buffer and ensures that the output voltage provided at contact pad 68 to the EML chip (not shown) has the proper voltage swing.

As indicated above, the transmission lines 16 and 17 shown in FIG. 1 result in about a 50% reduction in the voltage swing of the output voltage of the EML driver IC chip 2. The voltage follower 41 prevents this reduction in the voltage swing while also reducing the amount of current that is needed to produce the voltage swing, thereby reducing current consumption. In addition, the reduction in the amount of current that is needed does not limit the bandwidth or speed of the circuit 30. As will be described below in more detail, the current consumption of the circuit 30 is typically, but not necessarily, less than about 50% of that consumed by the circuit in FIG. 1.

The EML driver IC chip 40 has driver electronics 42 that drive the bases of a differential pair of BJTs 43 and 44. The emitters of the BJTs 43 and 44 are connected to one another and the collectors of the BJTs 43 and 44 are connected to respective pre-drive resistors $R_{PRE1}$ 46 and $R_{PRE2}$ 47 that are connected in parallel, where $R_{PRE1}$ equals $R_{PRE2}$ and is much greater than 50Ω. A typical value for $R_{PRE1}$ 46=$R_{PRE2}$ 47 is 250Ω, although other values may be used. The pre-drive resistors $R_{PRE1}$ 46 and $R_{PRE2}$ 47 are connected to a supply voltage, $V_{DD}$. The driver electronics 42 drive the bases of the BJTs 43 and 44 to produce a pre-drive output current, $I_{PRE\_OUT}$, which is represented by current source 45. This produces a pre-drive output voltage, $V_{PRE\_OUT}$, at the base of a third BJT 49 of the voltage follower 41. The voltage follower 41 has a supply voltage, $V_{DD\_DR}$. The driver output current, $I_{OUT\_DR}$, of the voltage follower 41 is represented by current source 51. The collector of BJT 49 is connected to the supply voltage $V_{DD\_DR}$. The emitter of BJT 49 is connected to an output contact pad 52 of the EML driver IC chip 40.

In accordance with this illustrative embodiment, the impedance matching network 60 has components 61, 62, 63, 64, 65, and 66 that are identical to the circuit components 18, 21, 22, 23, 25, and 26, respectively, of the impedance matching network 3 shown in FIG. 1. The impedance matching network 60 impedance matches the output impedance of the EML driver IC chip 40 with the input impedance of the EML chip (not shown). The impedance matching network 60 does not include the transmission lines 16 and 17 or the termination network 29 shown in FIG. 1, which allows the EML driver circuit 30 to be placed in very close proximity to the EML chip and to directly drive the EML chip. This allows the amount of area consumed by the circuit 30 and by the EML chip (not shown) to be greatly reduced while also reducing the cost and complexity of the impedance matching network 60.

As indicated above, the current consumption of the EML driver IC chip 40 is typically, but not necessarily, less than about 50% of that consumed by the EML driver IC chip 2 shown in FIG. 1. In the arrangement shown in FIG. 1, where $R_{L1}$=$R_{L2}$=50Ω, the source voltage, $V_{SOURCE}$, at either of the contact pads 13 or 14 is calculated as $V_{SOURCE}$=$I_O$×25Ω, where 25Ω is the parallel resistance $R_{L1} \| R_{L1}$. Thus, $I_O$=$V_{SOURCE}$/25Ω. In contrast, for the embodiment shown in FIG. 2, where, for example, $R_{PRE1}$=$R_{PRE2}$=250Ω, $V_{SOURCE}$=$I_O$×25Ω, where 25Ω is the parallel resistance $R_{L1} \| R_{L2}$. Thus, $I_{PRE\_OUT}$ needed to create the necessary voltage swing is calculated as $I_{PRE\_OUT}$=$V_{PRE\_OUT}$/$R_{PRE1}$. Because $R_{PRE1}$=250Ω is ten times greater than $R_{L1} \| R_{L2}$=25Ω, the current $I_{PRE\_OUT}$ is one-tenth of $I_O$. Consequently, the current consumption used by the EML driver IC chip 40 to generate the necessary voltage swing is approximately one-tenth of that used by the EML driver IC chip 2 shown in FIG. 1.

In accordance with an embodiment, the value of the termination resistor $R_T$ 65 of the impedance matching network 60 is higher than the 50Ω value typically used for $R_T$ 25 shown in FIG. 1. This in combination with judicious selections of the values of components 61-64 and 66 allows the aforementioned reduction in current consumption to be achieved without limiting the bandwidth or speed of the EML driver circuit 30. Persons of skill in the art will understand, in view of the description provided herein, how to select appropriate values for circuit components 61-66.

The EML driver IC chip 40 shown in FIG. 2 outputs a single-ended drive signal at contact pad 52 that swings between approximately $V_{DD\_DR}$ and approximately 0 volts. The EML chip (not shown) has contact pads that are connected to contact pads 67 and 68, respectively, of the impedance matching network 60 for providing the modulation and bias currents, respectively, to the EML chip. The EML driver IC chip 40 may also be configured to output a differential drive signal, as will now be described with reference to FIG. 3.

Figure 3:
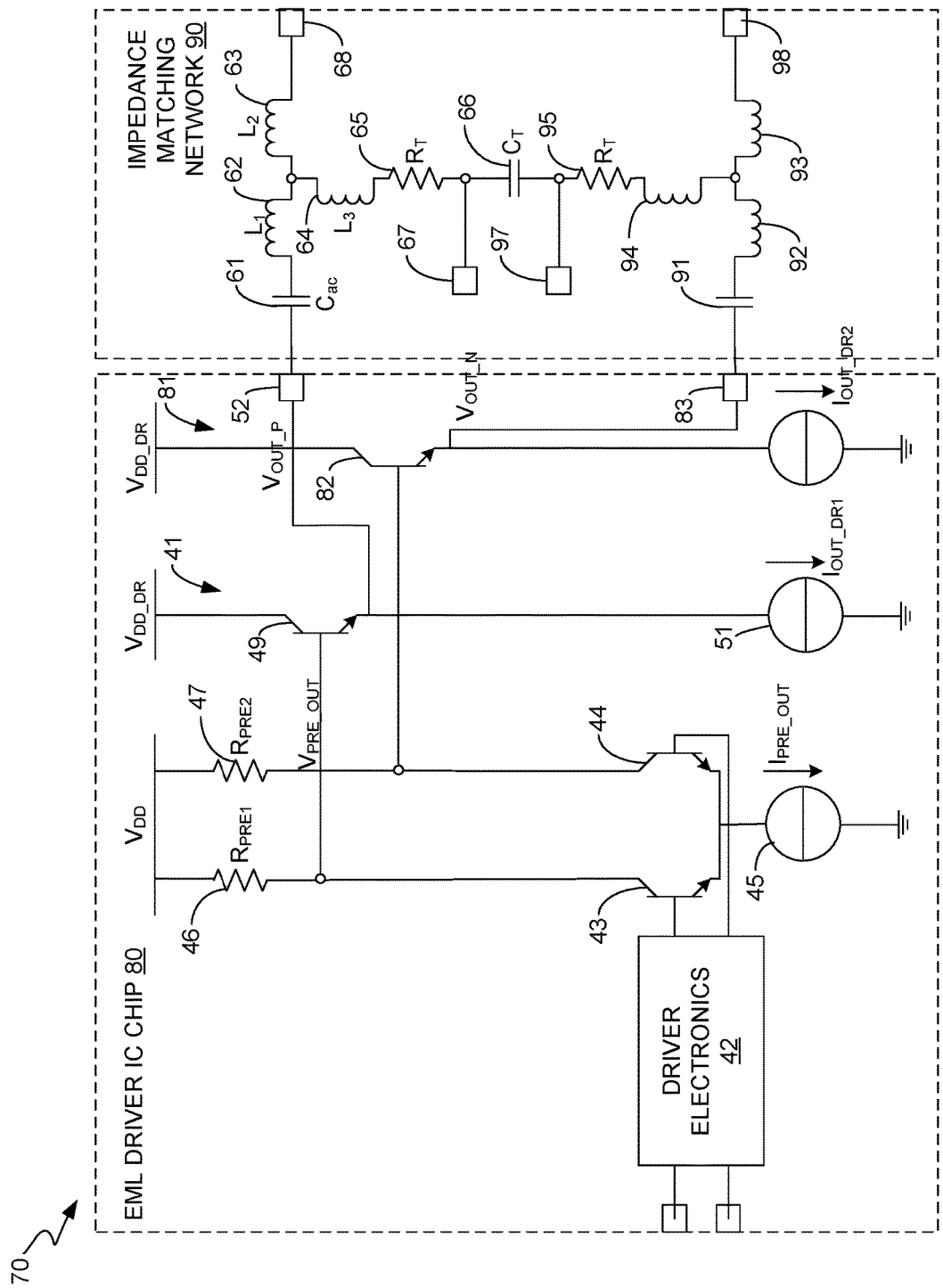
FIG. 3 is schematic diagram of a low-power, direct-drive EML driver circuit in accordance with another illustrative embodiment that produces a differential drive signal.

FIG. 3 is a schematic diagram of a low-power, direct-drive EML driver circuit 70 in accordance with another illustrative embodiment that produces a single-ended drive signal. The low-power, direct-drive EML driver circuit 70 includes an EML driver IC chip 80 and an impedance matching network 90. As with the embodiment shown in FIG. 2, the impedance matching network 90 may be separate from the EML driver IC chip 80 or integrated on the EML driver IC chip 80. The EML driver IC chip 80 is identical to the EML driver IC chip 40 except that the EML driver IC chip 80 also includes a second voltage follower 81 that acts as second voltage buffer. The second voltage follower 81 has a BJT 82 that has a base that is connected to the collector of BJT 44, a collector that is connected to the supply voltage $V_{DD\_DR}$, and an emitter that is connected to a contact pad 83. The differential output voltage of the EML driver IC chip 80 swings between a negative output voltage, $V_{OUT\_N}$, available at contact pad 83 and a positive output voltage, $V_{OUT\_P}$, available at contact pad 52.

In accordance with this illustrative embodiment, the impedance matching network 90 has circuit components 91-95 that are identical to circuit components 61-65, respectively. The portion of the impedance matching network 90 comprising components 61-66 performs impedance matching between the output impedance of the voltage follower 41 and the input impedance of the EML chip (not shown) at its connection to the contact pads 67 and 68 of the impedance matching network 90. The portion of the impedance matching network 90 comprising components 91-95 and 66 performs impedance matching between the output impedance of the voltage follower 81 and the input impedance of the EML chip (not shown) at its connection to the contact pads 97 and 98 of the impedance matching network 90. The EML chip has contact pads that are connected by bond wires or circuit board traces to contact pads 67, 68, 97, and 98 of the impedance matching network 90.

Because the impedance matching network 90 does not include the transmission lines 16 and 17 shown in FIG. 1, the amount of current needed to produce the voltage between $V_{OUT\_N}$ and $V_{OUT\_P}$ is about one-half of that required by the arrangement shown in FIG. 1 to produce the same voltage swing. The values of the circuit components 61-66 and 91-95 of the impedance matching network 90 are selected to ensure that the reduction in current is achieved without reducing the bandwidth or speed of the circuit 70.

The EML driver circuits 30 and 70 shown in FIGS. 2 and 3, respectively, are well suited for use in optical transmitters and transceivers that use a modulation technique known as pulse amplitude modulation (PAM)-4. In particular, the EML driver circuits 30 and 70 are well suited for use in optical transmitters and transceivers that use the PAM-4 modulation technique to operate at frequencies that are equal to or greater than about 25 Gigahertz (GHz). PAM-4 modulation techniques use four distinct pulse amplitude levels to convey information. Specifically, amplitude levels 1, 2, 3 and 4 are represented by bit pairs 00, 01, 11 and 10, respectively. One of the bit pairs is transmitted during each symbol period, which allows the bandwidth to be doubled compared to conventional binary modulation schemes. However, the EML driver circuits 30 and 70 are not limited to being used in systems that use a PAM-4 modulation technique.

It can be seen from the foregoing description that the EML driver circuits 30 and 70 reduce the complexity and cost of the impedance matching network by eliminating the transmission lines while also eliminating the reduction in voltage swing caused by the transmission lines. In addition, this is accomplished without limiting the bandwidth or speed of the direct-drive EML driver circuit, and while also achieving a reduction in the amount of power that is consumed in generating the necessary voltage swing of the drive signal.

It should be noted that the invention has been described with respect to illustrative embodiments for the purpose of describing the principles and concepts of the invention. The invention is not limited to these embodiments. For example, while the invention has been described with reference to the particular circuit configurations shown in FIGS. 2 and 3, variations may be made to the circuit configurations while still achieving the goals described herein, as will be understood by those skilled in the art in view of the description being provided herein. For example, circuit components may be added or removed from the circuits 30 and 70 shown in FIGS. 2 and 3, respectively, and circuit components that perform the same or similar functions to those shown in FIGS. 2 and 3 may be substituted for the circuit components shown in FIGS. 2 and 3. Persons of skill in the art will understand that these and other modifications may be made to the illustrative embodiments described above to achieve the goals of the invention and that all such modifications are within the scope of the invention.

What is claimed is:

1. An externally modulated laser (EML) driver circuit comprising:
    driver electronics that generate a differential driver signal comprising first and second driver signals;
    a differential transistor pair comprising first and second transistors, each transistor having first, second and third terminals, the first terminals being connected to first terminals of first and second resistors of the EML driver circuit, second terminals of the first and second resistors being connected to a supply voltage, the second terminals of the first and second transistors being connected together, the third terminals of the first and second transistors being connected to the driver electronics for receiving the first and second driver signals, respectively; and
    at least a third transistor having first, second and third terminals, the first terminal of the third transistor being connected to a supply voltage, the second terminal of the third transistor being connected to a first output terminal of the EML driver circuit, the third terminal of the third transistor being connected to the first terminal of one of the first and second transistors.

2. The EML driver circuit of claim 1, further comprising:
    an impedance matching network, the impedance matching network having an input terminal that is connected to the first output terminal of the EML driver circuit, the impedance matching network having at least first and second output terminals for connection to first and second input terminals of an EML chip having at least a first EML thereon.

3. The EML driver circuit of claim 2, further comprising:
    the EML chip, the first and second input terminals of the EML chip being connected to the first and second output terminals of the impedance matching network.

4. The EML driver circuit of claim 2, wherein the driver electronics, the differential transistor pair and the third transistor are integrated together on a first integrated circuit (IC) chip and wherein the impedance matching network is external to the first IC chip.

5. The EML driver circuit of claim 2, wherein the driver electronics, the differential transistor pair, the third transistor and the impedance matching network are integrated together on a first integrated circuit (IC) chip.

6. The EML driver circuit of claim 2, wherein the impedance matching network comprises at least a first inductor, a first alternating current (AC) decoupling capacitor and a first termination resistor, and wherein a resistance value of the first terminal resistor is greater than 50 ohms.

7. The EML driver circuit of claim 6, wherein the impedance matching network further comprises:
    at least second and third inductors and a first termination capacitor.

8. The EML driver circuit of claim 6, wherein the first and second resistors each having a resistance that is greater than 50 Ohms.

9. The EML driver circuit of claim 1, wherein the first and second resistors each having a resistance that is greater than 100 Ohms.

10. The EML driver circuit of claim 9, wherein the first and second resistors each have a resistance that is equal to or greater than 250 Ohms.

11. The EML driver circuit of claim 1, wherein the EML driver circuit is a single-ended driver circuit that outputs a single-ended EML drive signal from the first output terminal of the EML driver circuit.

12. The EML driver circuit of claim 11, wherein the single-ended EML drive signal has a frequency that is greater than or equal to 25 Gigahertz (GHz).

13. The EML driver circuit of claim 12, wherein the driver electronics use a pulse amplitude modulation (PAM)-4 modulation technique to modulate the single-ended drive signal.

14. The EML driver circuit of claim 1, wherein the third terminal of the third transistor is connected to the first terminal of the first transistor, and wherein the EML driver circuit further comprises:

at least a fourth transistor having first, second and third terminals, the first terminal of the fourth transistor being connected to a supply voltage, the second terminal of the fourth transistor being connected to a second output terminal of the EML driver circuit, the third terminal of the fourth transistor being connected to the first terminal of the second transistor, and wherein the EML driver circuit outputs a differential EML drive signal from the first and second output terminals of the EML driver circuit.

15. The EML driver circuit of claim 14, further comprising:
an impedance matching network, the impedance matching network having first and second input terminals that are connected to the first and second output terminals, respectively, of the EML driver circuit, the impedance matching network having at least first, second, third and fourth output terminals for connection to first, second, third and fourth input terminals, respectively, of an EML chip having at least a first EML thereon.

16. The EML driver circuit of claim 15, wherein the impedance matching network comprises at least a first, second, third, fourth, fifth and sixth inductors, first and second alternating current (AC) decoupling capacitors, first and second termination resistors, and a termination capacitor, and wherein a resistance value of the first and second terminal resistors is greater than 50 ohms.

17. The EML driver circuit of claim 15, wherein the differential EML drive signal has a frequency that is greater than or equal to 25 Gigahertz (GHz).

18. The EML driver circuit of claim 15, wherein the driver electronics use a pulse amplitude modulation (PAM)-4 modulation technique to modulate the differential drive signal.

19. A direct-drive externally modulated laser (EML) driver circuit comprising:
driver electronics that generate a differential driver signal comprising first and second driver signals;
a differential circuit comprising at least first and second transistors and first and second resistors, each transistor having first, second and third terminals, the first terminals being connected to first terminals of the first and second resistors, respectively, second terminals of the first and second resistors being connected to a first supply voltage, each resistor having a resistance value that is greater than 50 ohms, the second terminals of the first and second transistors being connected together, the third terminals of the first and second transistors being connected to the driver electronics for receiving the first and second driver signals, respectively;
a voltage buffer having an input terminal and an output terminal, the input terminal of the voltage buffer being connected to the first terminal of the first transistor, the output terminal of the voltage buffer being connected to a first output terminal of the EML driver circuit, wherein a single-ended EML drive signal is output from the first output terminal of the EML driver circuit; and
an impedance matching network having at least a first input terminal, a first output terminal, a first inductor, a first capacitor and a first resistor, the first input terminal being connected to the first output terminal of the EML driver circuit, the first output terminal being disposed for connection to an input terminal of an EML chip, wherein a resistance value of the first resistor of the impedance matching network is greater than 50 ohms.

20. The direct-drive EML circuit of claim 19, wherein the first and second resistors of the differential circuit each have a resistance value that is equal to or greater than 250 ohms.

21. A direct-drive externally modulated laser (EML) driver circuit comprising:
driver electronics that generate a differential driver signal comprising first and second driver signals;
a differential circuit comprising at least first and second transistors and first and second resistors, each transistor having first, second and third terminals, the first terminals being connected to first terminals of the first and second resistors, respectively, second terminals of the first and second resistors being connected to a first supply voltage, each resistor having a resistance value that is greater than 50 ohms, the second terminals of the first and second transistors being connected together, the third terminals of the first and second transistors being connected to the driver electronics for receiving the first and second driver signals, respectively;
a first voltage buffer having an input terminal and an output terminal, the input terminal of the voltage buffer being connected to the first terminal of the first transistor, the output terminal of the first voltage buffer being connected to a first output terminal of the EML driver circuit;
a second voltage buffer having an input terminal and an output terminal, the input terminal of the second voltage buffer being connected to the first terminal of the second transistor, the output terminal of the second voltage buffer being connected to a second output terminal of the EML driver circuit, wherein a differential EML drive signal is output from the first and second output terminals of the EML driver circuit; and
an impedance matching network having at least first and second input terminals, at least first and second output terminals, and a plurality of inductors, capacitors and resistors, the first and second input terminals of the impedance matching network being connected to the first and second output terminals of the EML driver circuit, respectively, the first and second output terminals of the impedance matching network being disposed for connection to first and second input terminals, respectively, of an EML chip.

* * * * *